US010144907B2

(12) United States Patent
Yokota et al.

(10) Patent No.: US 10,144,907 B2
(45) Date of Patent: Dec. 4, 2018

(54) POLISHING COMPOSITION

(71) Applicant: FUJIMI INCORPORATED, Kiyosu-shi, Aichi (JP)

(72) Inventors: Shuugo Yokota, Kiyosu (JP); Shota Suzuki, Kiyosu (JP); Tomohiko Akatsuka, Kiyosu (JP); Yasuyuki Yamato, Kiyosu (JP); Koichi Sakabe, Kiyosu (JP); Yoshihiro Izawa, Kiyosu (JP); Yukinobu Yoshizaki, Kiyosu (JP); Chiaki Saito, Kiyosu (JP)

(73) Assignee: FUJIMI INCORPORATED, Kiyosu-shi (JP)

( * ) Notice: Subject to any disclaimer, the term of this patent is extended or adjusted under 35 U.S.C. 154(b) by 0 days.

(21) Appl. No.: 15/129,326

(22) PCT Filed: Jan. 30, 2015

(86) PCT No.: PCT/JP2015/052761
§ 371 (c)(1),
(2) Date: Sep. 26, 2016

(87) PCT Pub. No.: WO2015/146282
PCT Pub. Date: Oct. 1, 2015

(65) Prior Publication Data
US 2017/0175053 A1    Jun. 22, 2017

(30) Foreign Application Priority Data

Mar. 28, 2014  (JP) .................................. 2014-069279

(51) Int. Cl.
| H01L 21/306 | (2006.01) |
| C11D 7/22 | (2006.01) |
| H01L 21/3105 | (2006.01) |
| H01L 21/321 | (2006.01) |
| H01L 21/02 | (2006.01) |
| C09K 3/14 | (2006.01) |
| C11D 7/26 | (2006.01) |
| C11D 7/28 | (2006.01) |
| C11D 7/32 | (2006.01) |
| C23G 5/028 | (2006.01) |

(52) U.S. Cl.
CPC .............. *C11D 7/22* (2013.01); *C09K 3/1409* (2013.01); *C11D 7/26* (2013.01); *C11D 7/28* (2013.01); *C11D 7/3209* (2013.01); *C23G 5/028* (2013.01); *H01L 21/02024* (2013.01); *H01L 21/02041* (2013.01); *H01L 21/31053* (2013.01); *H01L 21/3212* (2013.01)

(58) Field of Classification Search
CPC ................................................ C11D 11/0047
USPC ........................................................ 510/175
See application file for complete search history.

(56) References Cited

U.S. PATENT DOCUMENTS

| 2004/0074518 | A1 | 4/2004 | Korthuis et al. |
| 2004/0098924 | A1 | 5/2004 | Iwasa |
| 2005/0176606 | A1 | 8/2005 | Konno et al. |
| 2005/0205835 | A1 | 9/2005 | Tamboli et al. |
| 2006/0151854 | A1 | 7/2006 | Kawase et al. |
| 2007/0077764 | A1 | 4/2007 | Shimizu |
| 2007/0225187 | A1 | 9/2007 | Nishiwaki |
| 2007/0232512 | A1 | 10/2007 | Nishiwaki |
| 2010/0003821 | A1 | 1/2010 | Morinaga et al. |
| 2010/0167535 | A1 | 7/2010 | Nishiwaki et al. |
| 2010/0167547 | A1* | 7/2010 | Kamimura ............... C09G 1/02 438/693 |
| 2010/0294983 | A1 | 11/2010 | Matsushita et al. |
| 2012/0000485 | A1 | 1/2012 | Mizuta et al. |
| 2012/0048830 | A1* | 3/2012 | Uchida .................... C09G 1/02 216/53 |
| 2013/0032573 | A1 | 2/2013 | Ogata et al. |
| 2013/0053291 | A1 | 2/2013 | Otake et al. |
| 2013/0095660 | A1* | 4/2013 | Tanimoto .............. B24B 37/044 438/692 |
| 2013/0183826 | A1 | 7/2013 | Tsuchiya et al. |
| 2015/0140820 | A1 | 5/2015 | Kawada et al. |

FOREIGN PATENT DOCUMENTS

| EP | 1 569 267 A1 | 8/2005 |
| EP | 1 837 393 A2 | 9/2007 |
| JP | 07-142436 A | 6/1995 |
| JP | 2004-128089 A | 4/2004 |
| JP | 2007-103515 A | 4/2007 |
| JP | 2010-034509 A | 2/2010 |
| JP | 2010-177702 A | 8/2010 |
| JP | 2010-171362 A | 8/2012 |
| JP | 2012-145968 A | 8/2012 |
| JP | 2012-156181 A | 8/2012 |
| JP | 2014-017524 A | 1/2014 |
| TW | 200914596 A | 4/2009 |
| TW | 201226492 A | 7/2012 |

(Continued)

OTHER PUBLICATIONS

Chinese Office Action dated May 4, 2017 as issued in corresponding Chinese Patent Application No. 201580016859.4 and its English translation thereof.

(Continued)

*Primary Examiner* — Gregory E Webb
(74) *Attorney, Agent, or Firm* — Foley & Lardner LLP

(57) ABSTRACT

The purpose of the present invention is to provide a means to sufficiently remove impurities remaining on the surface of a polishing object after CMP.
The polishing composition of the present invention is a polishing composition which is used after polishing has been performed by using a polishing composition (A) including abrasive grains or an organic compound (A), and is characterized by including an organic compound (B) which includes at least one atom selected from the group consisting of a fluorine atom, an oxygen atom, a nitrogen atom, and a chlorine atom and has a molecular weight of 100 or more, a pH adjusting agent, and 0 to 1% by mass of abrasive grains.

12 Claims, No Drawings

(56) References Cited

FOREIGN PATENT DOCUMENTS

| WO | WO 2004/042812 A1 | 5/2004 |
| WO | WO 2005/040324 A1 | 5/2005 |
| WO | WO 2012/039390 A1 | 3/2012 |
| WO | WO 2013/028662 A2 | 2/2013 |
| WO | WO-2013/162020 A1 | 10/2013 |

OTHER PUBLICATIONS

Japanese Office Action and its English translation issued in corresponding application No. 2014-069279 dated Sep. 26, 2017.
Japanese Office Action and its English translation issued in corresponding Application No. 2014-069279 dated Feb. 6, 2018.
Chinese Office Action dated Dec. 14, 2017 as issued in corresponding Chinese Patent Application No. 201580016859.4 and its English translation thereof.
Taiwanese Office Action dated Apr. 25, 2018 in application No. 104104252 and an English translation thereof.

* cited by examiner

POLISHING COMPOSITION

TECHNICAL FIELD

The present invention relates to a polishing composition. More specifically, the present invention relates to a technique for removing impurities remaining on the surface of a polishing object after CMP.

BACKGROUND ART

In recent years, a so-called chemical mechanical polishing (CMP) technique for physically polishing and flattening a semiconductor substrate in producing a device is used in accordance with multilayer wiring on a surface of a semiconductor substrate. CMP is a method for flattening the surface of a polishing object (object to be polished) like a semiconductor substrate by using a polishing composition (slurry) containing abrasive grains such as silica, alumina, or ceria, an anti-corrosion agent, a surfactant, or the like. The polishing object (object to be polished) is silicon, polysilicon, silicon oxide film, silicon nitride, a wiring or a plug which consists of metal, or the like.

On the surface of a semiconductor substrate after CMP processing, residual impurities (defects) are present in a large amount. As for the impurities, there are abrasive grains, metals, an anti-corrosion agent and an organic material such as a surfactant that are derived from a polishing composition used for CMP, a silicon-containing material or a metal which is generated according to polishing of a silicon-containing material, metal wirings or plug as a polishing object, and also an organic material such as pad debris which is generated from various pads.

Once the surface of a semiconductor substrate is contaminated with those impurities, an adverse effect may be exhibited on electrical properties of a semiconductor, and thus there is a possibility of having lower device reliability. In addition, if contamination by organic materials is significant, breakage of a device may be caused. Thus, it is necessary to remove those impurities from the surface of a semiconductor substrate by introducing a cleaning step after CMP step.

For a cleaning step, a cleaning agent is used to remove those impurities from the surface of a semiconductor substrate, and various kinds of cleaning agent have been developed so far (see, Patent Literature 1)

CITATION LIST

Patent Literature

Patent Literature 1: WO 2005/040324 A (Specification of US 2012/000485 A)

SUMMARY OF INVENTION

Technical Problem

However, there is a problem that, since impurities are not sufficiently removed even by the above cleaning step, the impurities still remain on the surface of a polishing object like a semiconductor substrate.

Accordingly, an object of the present invention is to provide a means to sufficiently remove impurities remaining on the surface of a polishing object after CMP.

Solution to Problem

To solve the above problem, the inventors of the present invention conducted intensive studies. As a result, it was found that the cleaning effect by a cleaning step at later stage can be significantly improved when a polishing object is polished by using a novel polishing composition after CMP, and the present invention is completed accordingly.

Namely, the polishing composition of the present invention is used after polishing is performed by using a polishing composition (A) containing abrasive grains or an organic compound (A), and the polishing composition is characterized by containing an organic compound (B) which contains at least one atom selected from the group consisting of a fluorine atom, an oxygen atom, a nitrogen atom, and a chlorine atom and has a molecular weight of 100 or more, a pH adjusting agent, and 0 to 1% by mass of abrasive grains.

Effect of the Invention

According to the present invention, impurities remaining on the surface of a polishing object after CMP can be sufficiently removed.

DESCRIPTION OF EMBODIMENTS

Hereinbelow, the embodiments of the present invention are described. However, the present invention is not limited to the following embodiments.

<Polishing Composition>

A polishing composition according to an embodiment of the present invention is a polishing composition which is used after polishing is performed by using a polishing composition (A) including abrasive grains or an organic compound (A), including an organic compound (B) which has a molecular weight of 100 or more and includes at least one atom selected from the group consisting of a fluorine atom, an oxygen atom, a nitrogen atom, and a chlorine atom, a pH adjusting agent, and 0 to 1% by mass of abrasive grains.

Meanwhile, in the present specification, the polishing composition according to the present invention is referred to as a "polishing composition (B)" in order to distinguish it from the polishing composition (A). Furthermore, "polishing using the polishing composition (A)" and "polishing using the polishing composition (B)" are also referred to as "polishing (A)" and "polishing (B)", respectively.

As described above, the surface of a polishing object after CMP (polishing (A)) is contaminated with abrasive grains, metals, an anti-corrosion agent or an organic material such as a surfactant derived from the polishing composition (the polishing composition (A)) which has been used for CMP, a silicon-containing material or a metal which is generated according to polishing of a silicon-containing material, metal wirings or plug as a polishing object, and also organic materials such as pad debris which is generated from various pads. When the polishing composition (B) of the present invention is used for polishing of a polishing object adhered with such impurities, the cleaning effect of a cleaning step at later stage is significantly improved so that the impurities can be sufficiently removed from the surface of a polishing object.

Although the detailed mechanism for having the effect exhibited by the polishing composition (B) of this embodiment remains unclear, by the inventors of the present invention, it is believed to be related with the following mechanism. However, the present invention is not limited to the mechanism.

In the polishing (A), abrasive grains or an organic compound derived from the polishing composition (A), impurities that are generated according to polishing of a polishing object, pad debris, or the like are adhered to the surface of a polishing object. It is believed that adhesion of those impurities occurs based on the electric charges present on a surface of impurities and a surface of a polishing object or the hydrophobic interactions between them. The organic compound (B) contained in the polishing composition (B) of the present invention is characterized in that it contains at least one atom selected from the group consisting of a fluorine atom, an oxygen atom, a nitrogen atom, and a chlorine atom. In this regard, due to the presence of those atoms having high electronegativity, polarization occurs within the molecule, and thus the organic compound (B) is partially hydrophilized. Meanwhile, by having molecular weight of 100 or more, the organic compound (B) also have a hydrophobic part. For such reasons, if polishing is performed by using the polishing composition (B), impurities are replaced with the organic compound (B) or the impurities are floated by being surrounded by the compound based on hydrophobic interaction, and thus the impurities can be easily removed from the surface of a polishing object. Furthermore, since part of the molecule of the organic compound (B) is hydrophilic as described above, the wettability on the surface of a polishing object is improved, and according to cleaning with water or the like at later stage, the organic compound (B) itself can be easily removed. Hereinbelow, each constitutional component of the polishing composition (B) of this embodiment is described in detail.

[Organic Compound (B)]

The organic compound (B) has an activity of facilitating the removal of impurities, which remain on the surface of a polishing object by CMP, in a cleaning step at later stage. The organic compound (B) is characterized in that it contains at least one atom selected from the group consisting of a fluorine atom, an oxygen atom, a nitrogen atom, and a chlorine atom. By having those atoms having high electronegativity, polarization occurs within the molecule and thus the organic compound (B) can have partially hydrophilicity. As a result, not only the impurities can be easily removed but also the wettability on the surface of a polishing object can be improved. In particular, from the viewpoint of having easier polarization, it is preferable that the organic compound (B) has at least one atom selected from the group consisting of a fluorine atom, an oxygen atom, and a nitrogen atom.

Furthermore, examples of the functional group included in the organic compound (B) (functional group containing an oxygen atom and/or a nitrogen atom) include a hydroxyl group, an amino group, and the like, although it is not particularly limited thereto. Among them, from the viewpoint of having improved wettability, the organic compound (B) preferably has a hydroxyl group. Furthermore, for a case in which a hydroxyl group is contained, it is preferable that the organic compound (B) has 3 or more hydroxyl groups in one molecule. Furthermore, from the viewpoint of preventing re-adhesion, it is preferable that the organic compound (B) has one or more amino groups. Furthermore, for a case in which it contains an amino group, the organic compound (B) may have a cyclic amine structure.

Specific examples of the organic compound (B) include, as an organic compound having a hydroxyl group, hydroxyethyl cellulose (HEC), polyvinyl alcohol (PVA), polyglycerin, and polyoxyethylene polyglyceryl ether. Specific examples of the organic compound having an amino group include polyoxyethylene alkylamine and polyoxyethylene fatty acid amide ether. Specific examples of the organic compound having a cyclic amine structure include polyvinyl pyrrolidone (PVP). Specific examples of the organic compound having a fluorine atom include fluorinated alkyl-substituted glycol and partially fluorinated alcohol-substituted glycol. Specific examples of the organic compound having a chlorine atom include chlorinated alkyl-substituted glycol and partially chlorinated alcohol-substituted glycol.

As for the organic compound (B), either a product synthesized by a known method or a commercially available product can be used. In particular, from the viewpoint of having the effect of removal impurities or easy obtainability, it is preferably hydroxyethyl cellulose (HEC), polyvinyl alcohol (PVA), polyvinyl pyrrolidone (PVP), polyoxyethylene (6) polyglyceryl ether, polyoxyethylene lauric acid amide ether, polyoxyethylene stearylamine, partially fluorinated alcohol-substituted glycol, or the like. Meanwhile, the organic compound (B) may be used either singly or in combination of two or more types.

Molecular weight (weight average molecular weight) of the organic compound (B) is essentially 100 or more, preferably from 100 to 100,000, more preferably from 300 to 80,000, and still more preferably from 500 to 50,000. If the molecular weight (weight average molecular weight) is less than 100, it is impossible to have a hydrophobic part and the effect of removing impurities is not exhibited at sufficient level. Thus, having the molecular weight of 100 or more is an essential requirement. Meanwhile, if the molecular weight (weight average molecular weight) is 100,000 or less, it can be dispersed in water. Incidentally, in the present specification, a value measured by GPC-MALS method is employed as the weight average molecular weight. For the case of water soluble polymer having relatively low molecular weight, the weight average molecular weight can be measured by an NMR method.

Content of the organic compound (B) is, although not particularly limited, preferably 0.0001 to 1% by mass, more preferably 0.0005 to 0.8% by mass, and still more preferably 0.001 to 0.5% by mass relative to the total weight of the polishing composition. If the content of the organic compound (B) is 0.0001% by mass or more, impurities on the surface of a polishing object (in particular, organic materials) can be sufficiently removed. On the other hand, if the content is 1% by mass or less, it is possible to inhibit the organic compound (B) remaining on the surface of a polishing object after the polishing (B).

[pH Adjusting Agent]

The polishing composition of this embodiment essentially contains a pH adjusting agent. Accordingly, the polishing composition can be adjusted to a desired pH range. Meanwhile, pH of the polishing composition is, although not particularly limited, preferably 1 to 13, more preferably 1.5 to 12.5, and still more preferably 2 to 12. If pH is 2 or more, easy handleability is obtained. On the other hand, if pH is 12 or less, dissolution of abrasive grains can be inhibited in the case of containing abrasive grains.

As for the pH adjusting agent, an acid or an alkali used as a pH adjusting agent in corresponding technical field can be suitably employed. As for the acid or alkali, any one of an inorganic compound and an organic compound is acceptable.

Examples of the acid include inorganic acids such as sulfuric acid, nitric acid, boric acid, carbonic acid, hypophosphorous acid, phosphorous acid, and phosphoric acid; and organic acids such as carboxylic acids including formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, and lactic acid, and organic sulfuric acids including methanesulfonic acid, ethanesulfonic acid, and isethionic acid. Examples of the alkali include hydroxides of an alkali metal, such as potassium hydroxide; amines such as ammonia water, ethylene diamine, and piperazine; and quaternary ammonium salts such as tetramethyl ammonium and tetraethyl ammonium. These acids or alkalis can be used either singly or in combination of two or more types.

Content of the acid or alkali in the polishing composition is not particularly limited as long as it is an amount allowing the polishing composition within the aforementioned pH range.

[Dispersion Medium or Solvent]

The polishing composition of the present embodiment preferably contains water as a dispersion medium or a solvent for dispersing or dissolving each component. More preferably, the solvent is water. Water containing impurities at as low amount as possible is preferable from the viewpoint of suppressing the inhibition of the activity of other components. Specifically, pure water or ultra-pure water obtained by removing foreign matters through a filter after impurity ions are removed using an ion exchange resin, or distilled water is preferable.

[Abrasive Grains]

The polishing composition of the present embodiment may further contain abrasive grains, if necessary. However, to further enhance the effect of the present invention, concentration of the organic materials having molecular weight of 100 or more other than the organic compound (B) preferably has low concentration, and it is preferable that the materials are substantially not contained in the polishing composition.

In particular, it is preferable that the polishing composition of the present embodiment substantially does not contain abrasive grains. Meanwhile, the abrasive grains are the same as the abrasive grains that are contained in the polishing composition (A) described below, and detailed descriptions will be given for the polishing composition (A). Specifically, content of the abrasive grains is, relative to the total amount of the polishing composition, essentially 1% by mass or less, preferably 0.8% by mass or less, and more preferably 0.5% by mass or less. When the content of the abrasive grains is more than 1% by mass, there is a possibility that the abrasive grains remain on the surface of a polishing object even after a cleaning step which is performed later.

The method for producing the polishing composition (B) of the present embodiment is not particularly limited, and it can be obtained by mixing and stirring each component described above in water. The temperature for mixing each component is, although not particularly limited, preferably 10 to 40° C. Heating may be performed to increase the dissolution rate. The mixing time is not particularly limited, either.

[Polishing Composition (A)]

The polishing composition (A) contains at least one of abrasive grains and the organic compound (A).

The abrasive grains have an activity of polishing mechanically a polishing object, and they improve polishing rate of a polishing object by a polishing composition.

The abrasive grains may be any one of inorganic particles, organic particles, and organic and inorganic composite particle. Examples of the inorganic particles include particles composed of metal oxide such as silica, alumina, ceria, or titania, silicon nitride particles, silicon carbide particles, and boron nitride particles. Specific examples of the organic particles include methyl polymethacrylate (PMMA). In particular, from the viewpoint of easy obtainability and cost, silica is preferable. Colloidal silica is more preferable. Meanwhile, the abrasive grains may be used either singly or in combination of two or more types. Furthermore, a commercially available product or a synthesized product may be used as abrasive grains.

The abrasive grains may be surface-modified. General colloidal silica has a zeta potential value of nearly zero under acidic conditions, and therefore tends to cause agglomeration without electrical repulsion between silica particles under the acidic conditions. In contrast, abrasive grains which have been surface-modified so as to have a relatively large negative zeta potential value even under acidic conditions, are strongly repelled with each other and are well dispersed even under acidic conditions. As a result, the storage stability of the polishing composition is improved. Such surface-modified abrasive grains can be obtained by mixing a metal such as aluminum, titanium, or zirconium, or an oxide thereof with abrasive grains and doping the resulting mixture onto a surface of the abrasive grains.

Among those abrasive grains, colloidal silica obtained by immobilizing an organic acid on a surface (colloidal silica modified with organic acid) is particularly preferable. An organic acid is immobilized to a surface of colloidal silica contained in the polishing composition, for example, by chemically bonding a functional group of the organic acid to the surface of the colloidal silica. Only by making the colloidal silica and the organic acid coexist, the organic acid is not immobilized to the colloidal silica. For example, sulfonic acid which is a kind of an organic acid can be immobilized to colloidal silica by a method described in "Sulfonic acid-functionalized silica through quantitative oxidation of thiol groups", Chem. Commun. 246-247 (2003). Specifically, colloidal silica of which surface is immobilized with sulfonic acid can be obtained by coupling a silane coupling agent having a thiol group such as 3-mercaptopropyl trimethoxysilane to colloidal silica and then oxidizing the thiol group with hydrogen peroxide. Alternatively, carboxylic acid can be immobilized to colloidal silica by a method described in "Novel Silane Coupling Agents Containing a Photolabile 2-Nitrobenzyl Ester for Introduction of a Carboxy Group on the Surface of Silica Gel", Chemistry Letters, 3, 228-229 (2000). Specifically, colloidal silica of which surface is immobilized with carboxylic acid can be obtained by coupling a silane coupling agent containing a photoreactive 2-nitrobenzyl ester to colloidal silica and then irradiating the resulting product with light.

The lower limit of an average primary particle diameter of the abrasive grain is preferably 5 nm or more, more preferably 7 nm or more, and still more preferably 10 nm or more. Furthermore, the upper limit of the average primary particle diameter of the abrasive grain is preferably 500 nm or less, more preferably 100 nm or less, and still more preferably 70 nm or less. Within such a range, the polishing rate of the polishing object by the polishing composition is improved, and it is possible to further suppress an occurrence of dishing on the surface of the polishing object after the polishing object is polished using the polishing composition. Meanwhile, the average primary particle diameter of the abrasive grain is calculated, for example, based on a specific surface area of the abrasive grain which is measured by a BET method.

For a case in which the polishing composition (A) contains abrasive grains, the lower limit of the content of the abrasive grains is preferably 0.005% by mass or more, more preferably 0.5% by mass or more, still more preferably 1% by mass or more, and particularly preferably 3% by mass or more. Furthermore, the upper limit of the content of the abrasive grains is preferably 50% by mass or less, more preferably 30% by mass or less, and still more preferably 15% by mass or less. Within such a range, the polishing rate of the polishing object by the polishing composition is improved, cost related to the polishing composition (A) can be saved, and it is possible to further suppress an occurrence of dishing on the surface of the polishing object after the polishing object is polished by using the polishing composition (A).

The organic compound (A) is not particularly limited. Examples thereof include an agent which is added to suppress the polishing rate or etching rate, and specific examples thereof include a metal corrosion inhibitor for metal and dihydric alcohol for silicon-containing material.

The metal corrosion inhibitor is not particularly limited, but is preferably a heterocyclic compound or a surfactant. The number of members of the heterocyclic ring in the heterocyclic compound is not particularly limited. Furthermore, the heterocyclic compound may be a monocyclic compound or a polycyclic compound having a condensed ring.

Specific examples of the heterocyclic compound which can be used as a metal corrosion inhibitor include nitrogen-containing heterocyclic compounds such as a pyrrole compound, a pyrazole compound, an imidazole compound, a triazole compound, a tetrazole compound, a pyridine compound, a pyrazine compound, a pyridazine compound, a pyrindine compound, an indolizine compound, an indole compound, an isoindole compound, an indazole compound, a purine compound, a quinolizine compound, a quinoline compound, an isoquinoline compound, a naphthyridine compound, a phthalazine compound, a quinoxaline compound, a quinazoline compound, a cinnoline compound, a pteridin compound, a thiazole compound, an isothiazole compound, an oxazole compound, an isoxazole compound, and a furazan compound.

More specifically, examples of the pyrazole compound include 1H-pyrazole, 4-nitro-3-pyrazole carboxylic acid, 3,5-pyrazole carboxylic acid, 3-amino-5-phenylpyrazole, 5-amino-3-phenylpyrazole, 3,4,5-bromopyrazole, 3-aminopyrazole, 3,5-dimethylpyrazole, 3,5-dimethyl-1-hydroxymethylpyrazole, 3-methylpyrazole, 1-methylpyrazole, 3-amino-5-methylpyrazole, 4-amino-pyrazolo[3,4-d]pyrimidine, allopurinol, 4-chloro-1H-pyrazolo[3,4-d]pyrimidine, 3,4-dihydroxy-6-methylpyrazolo(3,4-b)-pyridine, 6-methyl-1H-pyrazolo[3,4-b]pyridin-3-amine, and the like.

Examples of the imidazole compound include imidazole, 1-methylimidazole, 2-methylimidazole, 4-methylimidazole, 1,2-dimethylpyrazole, 2-ethyl-4-methylimidazole, 2-isopropylimidazole, benzimidazole, 5,6-dimethylbenzimidazole, 2-aminobenzimidazole, 2-chlorobenzimidazole, 2-methylbenzimidazole, 2-(1-hydroxyethyl)benzimidazole, 2-hydroxybenzimidazole, 2-phenylbenzimidazole, 2,5-dimethylbenzimidazole, 5-methylbenzimidazole, 5-nitrobenzimidazole, and the like.

Examples of the triazole compound include 1,2,3-triazole (1H-BTA), 1,2,4-triazole, 1-methyl-1,2,4-triazole, methyl-1H-1,2,4-triazole-3-carboxylate, 1,2,4-triazole-3-carboxylic acid, 1,2,4-triazole-3-methyl carboxylate, 1H-1,2,4-triazole-3-thiol, 3,5-diamino-1H-1,2,4-triazole, 3-amino-1,2,4-triazole-5-thiol, 3-amino-1H-1,2,4-triazole, 3-amino-5-benzyl-4H-1,2,4-triazole, 3-amino-5-methyl-4H-1,2,4-triazole, 3-nitro-1,2,4-triazole, 3-bromo-5-nitro-1,2,4-triazole, 4-(1,2,4-triazol-1-yl)phenol, 4-amino-1,2,4-triazole, 4-amino-3,5-dipropyl-4H-1,2,4-triazole, 4-amino-3,5-dimethyl-4H-1,2,4-triazole, 4-amino-3,5 diheptyl-4H-1,2,4-triazole, 5-methyl-1,2,4-triazole-3,4-diamine, 1H-benzotriazole, 1-hydroxybenzotriazole, 1-aminobenzotriazole, 1-carboxybenzotriazole, 5-chloro-1H-benzotriazole, 5-nitro-1H-benzotriazole, 5-carboxy-1H-benzotriazole, 5-methyl-1H-benzotriazole, 5,6-dimethyl-1H-benzotriazole, 1-(1',2'-dicarboxyethyl)benzotriazole, 1-[N,N-bis(hydroxyethyl)aminomethyl]benzotriazole, 1-[N,N-bis(hydroxyethyl)aminomethyl]-5-methylbenzotriazole, 1-[N,N-bis(hydroxyethyl)aminomethyl]-4-methylbenzotriazole, and the like.

Examples of the tetrazole compound include 1H-tetrazole, 5-methyltetrazole, 5-aminotetrazole, 5-phenyltetrazole, and the like.

Examples of the indazole compound include 1H-indazole, 5-amino-1H-indazole, 5-nitro-1H-indazole, 5-hydroxy-1H-indazole, 6-amino-1H-indazole, 6-nitro-1H-indazole, 6-hydroxy-1H-indazole, 3-carboxy-5-methyl-1H-indazole, and the like.

Examples of the indole compound include 1H-indole, 1-methyl-1H-indole, 2-methyl-1H-indole, 3-methyl-1H-indole, 4-methyl-1H-indole, 5-methyl-1H-indole, 6-methyl-1H-indole, 7-methyl-1H-indole, 4-amino-1H-indole, 5-amino-1H-indole, 6-amino-1H-indole, 7-amino-1H-indole, 4-hydroxy-1H-indole, 5-hydroxy-1H-indole, 6-hydroxy-1H-indole, 7-hydroxy-1H-indole, 4-methoxyl-1H-indole, 5-methoxyl-1H-indole, 6-methoxyl-1H-indole, 7-methoxyl-1H-indole, 4-chloro-1H-indole, 5-chloro-1H-indole, 6-chloro-1H-indole, 7-chloro-1H-indole, 4-carboxy-1H-indole, 5-carboxy-1H-indole, 6-carboxy-1H-indole, 7-carboxy-1H-indole, 4-nitro-1H-indole, 5-nitro-1H-indole, 6-nitro-1H-indole, 7-nitro-1H-indole, 4-nitrile-1H-indole, 5-nitrile-1H-indole, 6-nitrile-1H-indole, 7-nitrile-1H-indole, 2,5-dimethyl-1H-indole, 1,2-dimethyl-1H-indole, 1,3-dimethyl-1H-indole, 2,3-dimethyl-1H-indole, 5-amino-2,3-dimethyl-1H-indole, 7-ethyl-1H-indole, 5-(aminomethyl)indole, 2-methyl-5-amino-1H-indole, 3-hydroxymethyl-1H-indole, 6-isopropyl-1H-indole, 5-chloro-2-methyl-1H-indole, and the like.

Among those heterocyclic compounds, the triazole compound is preferable. Particularly, 1H-benzotriazole, 5-methyl-1H-benzotriazole, 5,6-dimethyl-1H-benzotriazole, 1-[N,N-bis(hydroxyethyl)aminomethyl]-5-methylbenzotriazole, 1-[N,N-bis(hydroxyethyl)aminomethyl]-4-methylbenzotriazole, 1,2,3-triazole, and 1,2,4-triazole are preferable. These heterocyclic compounds have a high chemical or physical adsorption property on the surface of the polishing object, and therefore can form a strong protective film on the surface of the polishing object. This is advantageous in improving the flatness of the surface of a polishing object after the polishing object is polished by using the polishing composition (B) of the present invention. Meanwhile, the metal corrosion inhibitor may be used singly or in mixture of two or more kinds thereof. Furthermore, a commercially available product or a synthesized product may be used as the metal corrosion inhibitor.

Examples of the surfactant used as the metal corrosion inhibitor include an anionic surfactant, a cationic surfactant, an amphoteric surfactant, and a nonionic surfactant.

Examples of the anionic surfactant include polyoxyethylene alkyl ether acetic acid, polyoxyethylene alkyl sulfate ester, alkyl sulfate ester, polyoxyethylene alkyl ether sulfuric acid, alkyl ether sulfuric acid, alkyl benzene sulfonic acid, alkyl phosphate ester, polyoxyethylene alkyl phosphate ester, polyoxyethylene sulfosuccinic acid, alkyl sulfosuccinic acid, alkyl naphthalene sulfonic acid, alkyl diphenyl ether disulfonic acid, and salts thereof, and the like.

Examples of the cationic surfactant include an alkyl trimethyl ammonium salt, an alkyl dimethyl ammonium salt, an alkyl benzyl dimethyl ammonium salt, and an alkylamine salt, and the like.

Examples of the amphoteric surfactant include alkyl betaine and alkylamine oxide, and the like.

Examples of the nonionic surfactant include polyoxyalkylene alkyl ether such as polyoxyethylene alkyl ether, a sorbitan fatty acid ester, a glycerin fatty acid ester, a polyoxyethylene fatty acid ester, polyoxyethylene alkylamine, and alkyl alkanol amide, and the like. Among them, polyoxyalkylene alkyl ether is preferable.

Among these surfactants, polyoxyethylene alkyl ether acetic acid, polyoxyethylene alkyl ether sulfate, alkyl ether sulfate, and alkyl benzene sulfonate are preferable. These surfactants have a high chemical or physical adsorption property on the surface of the polishing object, and therefore can form a strong protective film on the surface of a polishing object. This is advantageous in improving the flatness of the surface of the polishing object after the polishing object is polished by using the polishing composition (B) of the present invention.

The lower limit of a content of the metal corrosion inhibitor in the polishing composition (A) is preferably 0.001 g/L or more, more preferably 0.005 g/L or more, and still more preferably 0.01 g/L or more. Furthermore, the upper limit of the content of the surfactant in the polishing composition (A) is preferably 10 g/L or less, more preferably 5 g/L or less, and still more preferably 2 g/L or less. Within such a range, dissolution of the metal is prevented so that deterioration of a surface state like surface roughness on the surface of a polishing object can be suppressed.

Examples of the dihydric alcohol include polyalkylene glycols such as methane diol, ethylene glycol (1,2-ethanediol), 1,2-propanediol, propylene glycol (1,3-propanediol), 1,2-butanediol, 1,4-butanediol, 1,2-pentanediol, 1,5-pentanediol, 1,6-hexanediol, 1,2-hexanediol, 1,5-hexanediol, 2,5-hexanediol, 1,7-heptanediol, 1,8-octanediol, 1,2-octanediol, 1,9-nonanediol, 1,2-decanediol, 1,10-decanediol, 1,12-dodecanediol, 1,2-dodecanediol, 1,14-tetradecanediol, 1,2-tetradecanediol, 1,16-hexadecanediol, 1,2-hexadecanediol, 2-methyl-2,4-pentanediol, 3-methyl-1,5-pentanediol, 2-methyl-2-propyl-1,3-propanediol, 2,4-dimethyl-2,4-dimethylpentanediol, 2,2-diethyl-1,3-propanediol, 2,2,4-trimethyl-1,3-pentanediol, dimethylol octane, 2-ethyl-1,3-hexanediol, 2,5-dimethyl-2,5-hexanediol, 2-methyl-1,8-octanediol, 2-butyl-2-ethyl-1,3-propanediol, 2,4-diethyl-1,5-pentanediol, 1,2-cyclohexanediol, 1,4-cyclohexanediol, 1,4-cyclohexane dimethanol, 1,2-cycloheptanediol, tricyclodecane dimethanol, hydrogenated catechol, hydrogenated resorcin, hydrogenated hydroquinone, diethylene glycol, polyethylene glycol, and polypropylene glycol, and polyester polyols.

Among them, ethylene glycol, propylene glycol, diethylene glycol, polyethylene glycol, and polyalkylene glycol are preferable.

Molecular weight of the dihydric alcohol is preferably less than 20,000. When the molecular weight is 20,000 or more, it is difficult to be dispersed homogeneously or dissolved in a dispersion medium or a solvent, and due to precipitation as a solid or the like, handling as a slurry may become difficult. Furthermore, when a polymer like polyethylene glycol is used as a dihydric alcohol, weight average molecular weight is used as molecular weight, and the weight average molecular weight is preferably less than 20,000, more preferably 10,000 or less, and still more preferably 5,000 or less. When the weight average molecular weight is within this range, it can be dispersed homogeneously or dissolved in a dispersion medium or a solvent so that the advantage of suppressing the polishing rate for a layer which contains a material other than the polishing object, for example, polycrystalline silicon or TEOS (Tetra Ethyl Ortho Silicate), can be fully exhibited. Meanwhile, as for the weight average molecular weight of polymer described in the present specification, a value measured by chromatography method (GPC method) is adopted.

Content of the dihydric alcohol in the polishing composition (A) is preferably 0.0001% by mass or more, more preferably 0.0005% by mass or more, and still more preferably 0.001% by mass or more. As the content of the dihydric alcohol increases, the advantage of suppressing polishing rate for a layer which contains a material other than the polishing object, for example, polycrystalline silicon or TEOS (Tetra Ethyl Ortho Silicate), can be obtained. Furthermore, the content of the dihydric alcohol in the polishing composition (A) is preferably 10% by mass or less, more preferably 5% by mass or less, and still more preferably 1% by mass or less. As the content of the dihydric alcohol decreases, the advantage of avoiding aggregation of abrasive grains can be obtained.

As for the dispersion medium or solvent for dispersing or dissolving each component in the polishing composition (A), the same dispersion medium or solvent for the polishing composition (B) described above can be used, and thus descriptions are omitted herein. Furthermore, if necessary, the same pH adjusting agent as the polishing composition (B) can be used for adjusting pH.

Meanwhile, in the present embodiment, the method for producing the polishing composition (A) and the method for the polishing (A) are not particularly limited, and a technique like CMP in the corresponding technical field can be suitably adopted.

<Polishing Method and Method for Producing Substrate>

According to one embodiment of the present invention, a polishing method for polishing a polishing object by using the polishing composition (B) is provided. Furthermore, according to another embodiment, a method for producing a substrate including a step for polishing a polishing object by the polishing method is provided. Hereinbelow, descriptions are given for the polishing method and method for producing a substrate of the present embodiment. Meanwhile, the polishing object in this embodiment is a polishing object which is obtained after the polishing (A) using the aforementioned polishing composition (A), and it is preferably a polishing object after the polishing (A) but before the cleaning step.

[Polishing Step]

The polishing object of the present embodiment is not particularly limited, but it is preferably a substrate which includes a metal, a material of Group IV, or a silicon material. By polishing the polishing object, a substrate can be produced. Examples of the metal include Cu, W, Al, Ta, and TiN. Examples of the material of Group IV include Ge (germanium) and SiGe (silicon germanium). Furthermore, examples of the silicon material include silicon, polysilicon, silicon oxide, and silicon oxide.

Among them, from the viewpoint of obtaining even higher effect of the present invention, the polishing object is preferably a hydrophobic material. In the present specification, the hydrophobic material indicates a material showing "contact angle" of more than 40° when "contact angle" is obtained, before polishing, by using θ/2 method after taking a photo of a water droplet which has been dropped on a surface of a material by using a wafer cleanness and treatment analyzer CA-X200 manufactured by Kyowa Interface Science Co., Ltd. Examples of the hydrophobic material include materials other than oxide, and metals such as Cu, W, Al, Ta, and TiN and silicon materials such as polysilicon and silicon nitride can be mentioned. Among them, silicon, polysilicon, and silicon nitride are preferable from the viewpoint of strictly reducing the remaining organic materials or abrasive grains.

As a polishing apparatus, it is possible to use a general polishing apparatus including a holder for holding a substrate or the like having a polishing object, a motor or the like having a changeable rotation number, and a polishing platen to which a polishing pad (polishing cloth) can be attached.

As the polishing pad, a general nonwoven fabric, polyurethane, a porous fluororesin, or the like can be used without any particular limitation. The polishing pad is preferably grooved such that a polishing liquid can be stored therein.

In the present embodiment, the polishing pad is preferably a soft pad. Specifically, a pad with pad hardness of 60 or less, and preferably 50 or less is preferable. By using such soft pad, flaws (scratches) caused by polishing can be reduced. Meanwhile, in the present specification, the pad hardness means Shore D hardness of a polishing pad.

Polishing conditions are not particularly limited, either. For example, the rotation number of a polishing platen and rotation number of a head are preferably from 10 to 500 rpm, and the pressure (polishing pressure) applied to a substrate having a polishing object is preferably from 0.5 to 10 psi. A method for supplying a polishing composition to a polishing pad is not particularly limited, either. For example, a method in which a polishing composition is supplied continuously using a pump or the like can be employed (discarded after single use). The supply amount is not limited, but a surface of the polishing pad is preferably covered all the time with the polishing composition of the present invention, and it is from 10 to 10,000 ml/minute. The polishing time is not particularly limited, either. However, for the step of using the polishing composition (B), it is preferably from 5 to 60 seconds. When it is within this range, the impurities can be sufficiently removed.

[Cleaning Step]

According to the present embodiment, it is preferable to have, after completing the polishing, a cleaning step for cleaning the surface of a polishing object. The cleaning step is a step in which water or a special cleaning liquid is added onto a wafer, and simultaneously, rubbing is performed while applying pressure using a brush like PVA sponge. Furthermore, it is preferable that the polishing object after cleaning is dried by flicking off water droplets adhered onto the surface by using a spin dryer or the like.

EXAMPLES

The present invention will be described in greater detail with the following Examples and Comparative Examples. However, the present invention is not limited to the following Examples.

Example 1

<Polishing (CMP) Using the Polishing Composition (A)>
By using polishing composition A1 (composition; 6% by mass of colloidal silica modified with sulfonic acid (manufactured by the method described in "Sulfonic acid-functionalized silica through quantitative oxidation of thiol groups", Chem. Commun. 246-247 (2003), primary particle diameter of 30 nm, secondary particle diameter of 60 nm, same hereinbelow) and 0.02% by mass of polyethylene glycol (molecular weight: 400), solvent: water, adjusted to pH=2 using 60% nitric acid) as the polishing composition (A), polishing was performed under the following conditions.
Polishing object: 200 mm polysilicon wafer
Polishing machine: single surface polishing machine for 200 mm wafer
Polishing pad: foamed polyurethane pad (hardness 90)
Polishing pressure: 2.3 psi (1 psi=6894.76 Pa, same hereinbelow)
Rotation number of polishing platen: 93 rpm
Supply of polishing composition: discarded after single use
Supply amount of polishing composition: 100 ml/minute
Rotation number of head: 87 rpm
Polishing time: for 60 seconds.
<Polishing Using the Polishing Composition (B)>
Polysilicon after the polishing (CMP) using the above polishing composition (A) was polished under the following conditions by using polishing composition B1 (composition; 0.1% by mass of polyvinyl alcohol (molecular weight: 10,000), solvent; water, adjusted to pH=4 using citric acid) as the polishing composition (B).
Polishing machine: single surface polishing machine for 200 mm wafer
Polishing pad: foamed polyurethane pad (hardness 90)
Polishing pressure: 1.5 psi
Rotation number of polishing platen: 88 rpm
Supply of polishing composition: discarded after single use
Supply amount of slurry: 100 ml/minute
Rotation number of head: 85 rpm
Polishing time: for 10 seconds.
<Cleaning>
Rubbing was performed for 60 seconds by applying pressure using PVA sponge while water is added to a wafer.

Example 2

The polishing and cleaning were performed in the same manner as Example 1 except that the polishing time was set at 15 seconds for the above <Polishing using the polishing composition (B)>.

Comparative Example 1

The polishing and cleaning were performed in the same manner as Example 1 except that the above <Polishing using the polishing composition (B)> was not performed.

Example 3

<Polishing (CMP) Using the Polishing Composition (A)>
By using polishing composition A2 (composition; 3% by mass of colloidal silica (primary particle diameter of 90 nm, secondary particle diameter of 175 nm) and 0.07% by mass of dipolyoxyethylene (6) lauryl ether phosphoric acid, solvent: water, adjusted to pH=11 using tetramethyl ammonium hydroxide (TMAH)) as the polishing composition (A), polishing was performed under the following conditions.

Polishing object: 300 mm polysilicon wafer
Polishing machine: single surface polishing machine for 300 mm wafer
Polishing pad: foamed polyurethane pad (hardness 90)
Polishing pressure: 2.0 psi
Rotation number of polishing platen: 63 rpm
Supply of polishing composition: discarded after single use
Supply amount of polishing composition: 300 ml/minute
Rotation number of head: 57 rpm
Polishing time: for 60 seconds.
<Polishing Using the Polishing Composition (B)>
Polysilicon after the polishing (CMP) using the above polishing composition (A) was polished under the following conditions by using polishing composition B2 (composition; 0.03% by mass of hydroxyethyl cellulose (molecular weight: 1,300,000), solvent; water, adjusted to pH=10 using ammonia water) as the polishing composition (B).
Polishing machine: single surface polishing machine for 300 mm wafer
Polishing pad: suede type polishing pad (hardness: 10)
Polishing pressure: 1.5 psi
Rotation number of polishing platen: 88 rpm
Supply of polishing composition: discarded after single use
Supply amount of slurry: 300 ml/minute
Rotation number of head: 85 rpm
Polishing time: for 30 seconds.

Example 4

The polishing and cleaning were performed in the same manner as Example 3 except that a suede type polishing pad (hardness: 42) was used as a polishing pad for the above <Polishing using the polishing composition (B)>.

Example 5

<Polishing (CMP) Using the Polishing Composition (A)>
By using polishing composition A3 (composition; 1.0% by mass of hydrogen peroxide water (31%), 1.2% by mass of the aforementioned colloidal silica modified with sulfonic acid, 0.0005% by mass of polyethylene glycol (molecular weight: 400), solvent: water, adjusted to pH=2 using citric acid) as the polishing composition (A), polishing was performed under the following conditions.
Polishing object: 300 mm TiN wafer, 300 mm Si wafer
Polishing machine: single surface polishing machine for 300 mm wafer
Polishing pad: foamed polyurethane pad (hardness 90)
Polishing pressure: 1.5 psi
Rotation number of polishing platen: 93 rpm
Supply of polishing composition: discarded after single use
Supply amount of polishing composition: 200 ml/minute
Rotation number of head: 87 rpm
Polishing time: for 60 seconds.
<Polishing Using the Polishing Composition (B)>
TiN wafer and Si wafer after the polishing (CMP) using the above polishing composition (A) were polished under the following conditions by using polishing composition B2 as the polishing composition (B).
Polishing machine: single surface polishing machine for 300 mm wafer
Polishing pad: suede type polishing pad (hardness: 42)
Polishing pressure: 1.5 psi
Rotation number of polishing platen: 88 rpm
Supply of polishing composition: discarded after single use
Supply amount of slurry: 300 ml/minute
Rotation number of head: 85 rpm
Polishing time: for 20 seconds.

Example 6

The polishing and cleaning were performed in the same manner as Example 5 except that polishing composition B3 (composition; 0.1% by mass of polyvinyl alcohol (molecular weight: 10,000), solvent: water, adjusted to pH=10 using ammonia water) was used as the polishing composition (B) of the aforementioned <Polishing using the polishing composition (B)>.

Example 7

The polishing and cleaning were performed in the same manner as Example 5 except that polishing composition B4 (composition; 0.6% by mass of polyvinyl pyrrolidone (molecular weight: 40,000), solvent: water, adjusted to pH=10 using ammonia water) was used as the polishing composition (B) of the aforementioned <Polishing using the polishing composition (B)>.

Comparative Example 2

The polishing and cleaning were performed in the same manner as Example 5 except that the above <Polishing using the polishing composition (B)> was not performed.

Example 8

<Polishing (CMP) Using the Polishing Composition (A)>
By using polishing composition A4 (composition; 5% by mass of colloidal silica (primary particle diameter: 30 nm, secondary particle diameter: 60 nm), solvent: water, adjusted to pH=11 using tetramethyl ammonium hydroxide (TMAH)) as the polishing composition (A), polishing was performed under the following conditions.
Polishing object: polysilicon wafer
Polishing machine: single surface polishing machine for 300 mm wafer
Polishing pad: foamed polyurethane pad (hardness 90)
Polishing pressure: 1.8 psi
Rotation number of polishing platen: 97 rpm
Supply of polishing composition: discarded after single use
Supply amount of polishing composition: 200 ml/minute
Rotation number of head: 103 rpm
Polishing time: for 60 seconds.
<Polishing Using the Polishing Composition (B)>
Polysilicon after the polishing (CMP) using the above polishing composition (A) was polished under the following conditions by using polishing composition B5 (composition; 0.1% by mass of polyoxyethylene (6) polyglyceryl ether (molecular weight: 450), solvent: water, adjusted to pH=10 using potassium hydroxide) as the polishing composition (B).
Polishing machine: single surface polishing machine for 300 mm wafer
Polishing pad: foamed polyurethane pad (hardness 90)
Polishing pressure: 1.5 psi
Rotation number of polishing platen: 88 rpm
Supply of polishing composition: discarded after single use
Supply amount of slurry: 200 ml/minute
Rotation number of head: 85 rpm
Polishing time: for 15 seconds.

Example 9

The polishing and cleaning were performed in the same manner as Example 8 except that polishing composition B6

(0.1% by mass of polyoxyethylene (6) lauric acid amide ether (molecular weight: 467), solvent: water, adjusted to pH=10 using potassium hydroxide) was used as the polishing composition (B) for the above <Polishing using the polishing composition (B)>.

Example 10

The polishing and cleaning were performed in the same manner as Example 8 except that polishing composition B7 (0.1% by mass of polyoxyethylene (6) stearylamine (molecular weight: 533), solvent: water, adjusted to pH=10 using potassium hydroxide) was used as the polishing composition (B) for the above <Polishing using the polishing composition (B)>.

Example 11

The polishing and cleaning were performed in the same manner as Example 8 except that polishing composition B8 (0.1% by mass of partially fluorinated alcohol-substituted glycol(F(CF$_2$)$_6$—(CH$_2$—CH$_2$O)$_6$—H) (molecular weight: 584), solvent: water, adjusted to pH=10 using potassium hydroxide) was used as the polishing composition (B) for the above <Polishing using the polishing composition (B)>.

Comparative Example 3

The polishing and cleaning were performed in the same manner as Example 8 except that the above <Polishing using the polishing composition (B)> was not performed.

<Method for Evaluation>
(Number of Defects on Surface of Polishing Object)

By using a wafer surface examining device (SP-1, manufactured by KLA-Tencor), defects with a size of 0.13 μm or larger were measured and evaluated.

(Wettability on Surface of Polishing Object)

By using θ/2 method, measurement of water contact angle was carried out. Meanwhile, for the measurement, a wafer cleanness and treatment analyzer CA-X200 manufactured by Kyowa Interface Science Co., Ltd. was used.

The results are shown in Table 1 to Table 4.

TABLE 1

| | Polishing (A) | | Polishing (B) | | Number of defects which are 0.13 μm or larger [count] | Contact angle [°] |
|---|---|---|---|---|---|---|
| | Polishing composition | Polishing time [seconds] | Polishing composition | Polishing time [seconds] | | |
| Example 1 | A1 | 60 | B1 | 10 | 36 | 38 |
| Example 2 | A1 | 60 | B1 | 15 | 24 | 38 |
| Comparative Example 1 | A1 | 60 | — | — | 16965 | 62 |

Polishing composition A1: colloidal silica modified with sulfonic acid 6% by mass, polyethylene glycol (molecular weight: 400) 0.02% by mass, adjusted to pH = 2 using nitric acid
Polishing composition B1: polyvinyl alcohol (molecular weight: 10000) 0.1% by mass, adjusted to pH = 4 using citric acid

TABLE 2

| | Polishing (A) | | Polishing (B) | | | Number of defects which are 0.13 μm or larger [count] |
|---|---|---|---|---|---|---|
| | Polishing composition | Polishing time [seconds] | Polishing pad | Polishing composition | Polishing time [seconds] | |
| Example 3 | A2 | 60 | Suede type polishing pad (hardness: 10) | B2 | 30 | 3102 |
| Example 4 | A2 | 60 | Suede type polishing pad (hardness: 42) | B2 | 30 | 44 |

Polishing composition A2: colloidal silica 3% by mass, dipolyoxyethylene (6) lauryl ether phosphoric acid 0.07% by mass, adjusted to pH = 11 using TMAH
Polishing composition B2: hydroxyethyl cellulose (molecular weight: 1,300,000) 0.03% by mass, adjusted to pH = 10 using ammonia water

TABLE 3

| | Polishing (A) | | Polishing (B) | | Polishing rate in the polishing (A) [Å/minute] | | Number of defects which are 0.13 μm or larger [count] | |
|---|---|---|---|---|---|---|---|---|
| | Polishing composition | Polishing time [seconds] | Polishing composition | Polishing time [seconds] | TiN | Si | TiN | Si |
| Example 5 | A3 | 60 | B2 | 20 | 227 | 20 | 3494 | 65 |
| Example 6 | A3 | 60 | B3 | 20 | 225 | 28 | 3194 | 19 |

TABLE 3-continued

| | Polishing (A) | | Polishing (B) | | Polishing rate in the polishing (A) [Å/minute] | | Number of defects which are 0.13 μm or larger [count] | |
|---|---|---|---|---|---|---|---|---|
| | Polishing composition | Polishing time [seconds] | Polishing composition | Polishing time [seconds] | TiN | Si | TiN | Si |
| Example 7 | A3 | 60 | B4 | 20 | 221 | 23 | 3163 | 16 |
| Comparative Example 2 | A3 | 60 | — | — | 223 | 23 | 5494 | 13243 |

Polishing composition A3: 31% hydrogen peroxide water 1.0% by mass, colloidal silica modified with sulfonic acid 1.2% by mass, polyethylene glycol (molecular weight: 400) 0.0005% by mass, adjusted to pH = 2 using citric acid
Polishing composition B2: hydroxyethyl cellulose (molecular weight: 1,300,000) 0.03% by mass, adjusted to pH = 10 using ammonia water
Polishing composition B3: polyvinyl alcohol (molecular weight: 10,000) 0.1% by mass, adjusted to pH = 10 using ammonia water
Polishing composition B4: polyvinyl pyrrolidone (molecular weight: 40,000) 0.6% by mass, adjusted to pH = 10 using ammonia water

TABLE 4

| | Polishing (A) | | Polishing (B) | | Number of defects which are 0.13 μm or larger [count] | Contact angle [°] |
|---|---|---|---|---|---|---|
| | polishing composition | Polishing time [seconds] | Slurry | Polishing time [seconds] | | |
| Example 8 | A4 | 60 | B5 | 15 | 6449 | 36.3 |
| Example 9 | A4 | 60 | B6 | 15 | 2369 | 30.7 |
| Example 10 | A4 | 60 | B7 | 15 | 1487 | 30.7 |
| Example 11 | A4 | 60 | B8 | 15 | 4062 | 35.4 |
| Comparative Example 3 | A4 | 60 | — | — | 17113 | 62.0 |

Polishing composition A4: colloidal silica 5% by mass, adjusted to pH = 11 using TMAH
Polishing composition B5: polyoxyethylene (6) polyglyceryl ether (molecular weight: 450) 0.1% by mass, adjusted to pH = 10 using potassium hydroxide
Polishing composition B6: polyoxyethylene (6) lauric acid amide ether (molecular weight: 467) 0.1% by mass, adjusted to pH = 10 using potassium hydroxide
Polishing composition B7: polyoxyethylene (6) stearylamine (molecular weight: 533) 0.1% by mass, adjusted to pH = 10 using potassium hydroxide
Polishing composition B8: partially fluorinated alcohol-substituted glycol (molecular weight: 584) 0.1% by mass, adjusted to pH = 10 using potassium hydroxide
Molecular weight was calculated by having molecular weight of each atom of H, C, O, N, and F as 1, 12, 16, 14, and 19

As shown in Table 1 to Table 4, by using the polishing composition (B) of the present invention, it was found that the wettability on the surface of a polishing object was improved and the impurities (defects) were sufficiently removed.

The present application is based on the Japanese patent application No. 2014-069279 filed on Mar. 28, 2014, and a disclosed content thereof is incorporated herein as a whole by reference.

The invention claimed is:

1. A method for producing a substrate comprising
   (1) polishing a polishing object using a polishing composition (A) comprising abrasive grains or an organic compound (A); and
   (2) subsequently polishing the polishing object using a polishing composition (B) comprising:
   an organic compound (B) which includes at least one atom selected from the group consisting of a fluorine atom, an oxygen atom, a nitrogen atom, and a chlorine atom, and has a molecular weight of 100 or more; and
   a pH adjusting agent consisting of at least one acid, wherein the polishing composition (B) does not comprise abrasive grains.

2. The method for producing a substrate according to claim 1, wherein the polishing object is a hydrophobic material.

3. The method for producing a substrate according to claim 2, wherein the polishing object includes polysilicon.

4. The method for producing a substrate according to claim 1, wherein the organic compound (B) has 3 or more hydroxyl groups.

5. The method for producing a substrate according to claim 1, wherein the organic compound (B) has one or more amino groups.

6. The method for producing a substrate according to claim 1, wherein the organic compound (B) is selected from the group consisting of hydroxyethyl cellulose, polyvinyl alcohol, polyglycerin, polyoxyethylene polyglyceryl ether, polyoxyethylene alkylamine, polyoxyethylene fatty acid amide ether, polyvinyl pyrrolidone, fluorinated alkyl-substituted glycol, partially fluorinated alcohol-substituted glycol, chlorinated alkyl-substituted glycol, partially chlorinated alcohol-substituted glycol polyoxyethylene polyglyceryl ether, polyoxyethylene lauric acid amide ether, polyoxyethylene stearylamine, and combinations thereof.

7. A method for polishing a polishing object comprising:
   (1) polishing the polishing object using a polishing composition (A) comprising abrasive grains or an organic compound (A); and
   (2) subsequently polishing the polishing object using a polishing composition (B) comprising:
   an organic compound (B) which includes at least one atom selected from the group consisting of a fluorine atom, an oxygen atom, a nitrogen atom, and a chlorine atom, and has a molecular weight of 100 or more; and a pH adjusting agent consisting of at least one acid, wherein the polishing composition (B) does not comprise abrasive grains.

8. The polishing method according to claim 7, wherein the polishing object is a hydrophobic material.

9. The polishing method according to claim 7, wherein the polishing object includes polysilicon.

10. The polishing method according to claim 7, wherein the organic compound (B) has 3 or more hydroxyl groups.

11. The polishing method according to claim 7, wherein the organic compound (B) has one or more amino groups.

12. The polishing method according to claim 7, wherein the organic compound (B) is selected from the group consisting of hydroxyethyl cellulose, polyvinyl alcohol, polyglycerin, polyoxyethylene polyglyceryl ether, polyoxyethylene alkylamine, polyoxyethylene fatty acid amide ether, polyvinyl pyrrolidone, fluorinated alkyl-substituted glycol, partially fluorinated alcohol-substituted glycol, chlorinated alkyl-substituted glycol, partially chlorinated alcohol-substituted glycol polyoxyethylene polyglyceryl ether, polyoxyethylene lauric acid amide ether, polyoxyethylene stearylamine, and combinations thereof.

* * * * *